Nov. 23, 1965 P. R. LEVI-LAMOND 3,219,890
SEMICONDUCTOR BARRIER-LAYER DEVICE AND TERMINAL STRUCTURE THEREON
Filed Feb. 25, 1959
FIG. 1
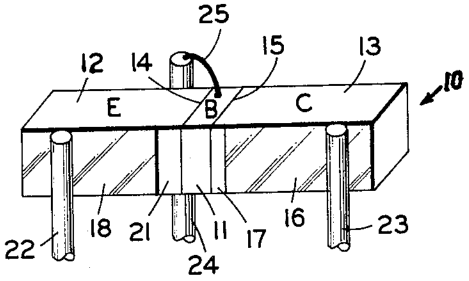
FIG. 2
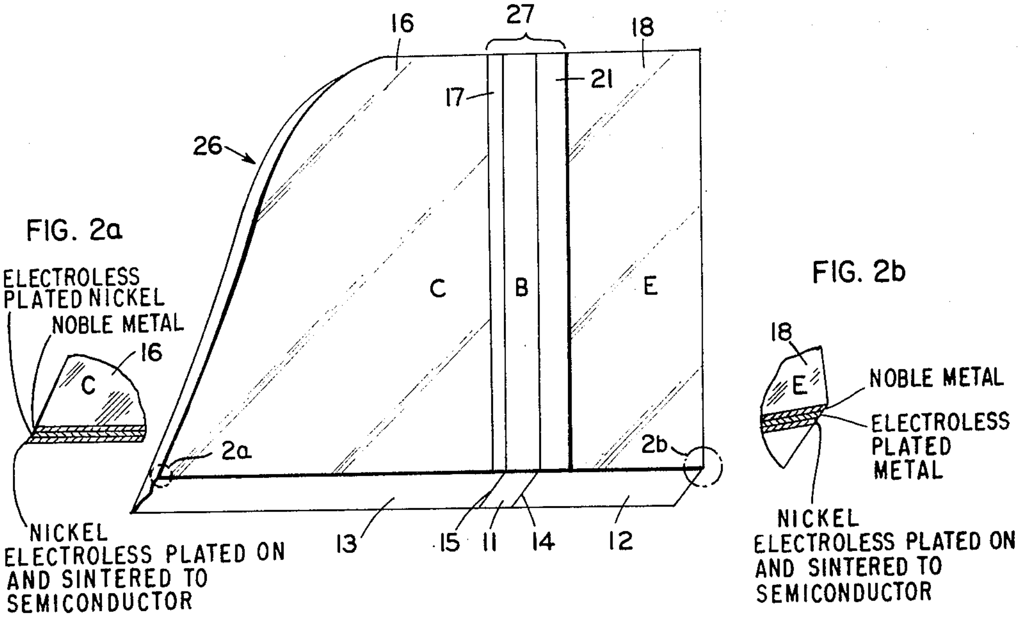
FIG. 2a, FIG. 2b
INVENTOR.
PIERRE R. LEVI-LAMOND
BY
Ezekiel Wolf, Wolf + Greenfield
ATTORNEYS 3,219,890
Patented Nov. 23, 1965

3,219,890
SEMICONDUCTOR BARRIER-LAYER DEVICE AND TERMINAL STRUCTURE THEREON

Pierre R. Levi-Lamond, Cambridge, Mass., assignor, by mesne assignments, to Transitron Electronic Corporation, Wakefield, Mass., a corporation of Delaware Filed Feb. 25, 1959, Ser. No. 795,517
11 Claims. (Cl. 317—234)

The present invention relates in general to junction bar transistors and more particularly concerns a novel transistor of this type characterised by sturdy construction and exceptionally low bulk collector resistance. Moreover, the novel techniques for fabricating this transistor simplifies its assembly while facilitating the production of a large number of individual bar transistors having uniform electrical characteristics.

The importance of lowering bulk collector resistance will be better understood by first considering some basic physical principles applicable to a junction transistor and the usual physical construction of a practical bar junction transistor. In a conventional bar transistor, a very narrow base region separates much wider emitter and collector regions of opposite conductivity types so that oppositely polarized P-N junctions are formed between the base and each of the latter regions. Normally, a rod at each end of the bar is alloyed thereto to support the bar above a suitable supporting base and serve as electrical connections to the emitter and collector regions. A third lead is directly connected to the narrow base region. As a result, virtually the entire resistance of the relatively wide collector region is presented between the base and collector electrodes.

While this resistance, called the bulk collector resistance, is not objectionable for low frequency operation, its presence is extremely detrimental to high frequency operation because the effective capacity across the normally reverse-biased junction between base and collector must exchange charge with an external circuit through the bulk collector resistance. A capacity is established across the junction by the oppositely polarized charge layers which accumulate on opposite sides of the junction. The spacing between these charge layers is inversely proportional to the magnitude of the reverse biasing potential. Since capacity is inversely propotional to the spacing between opposed charge layers, it follows that at low reverse biasing potentials, this capacity is not insignificant and the time constant of such capacity in series with the bulk collector resistance may be sufficiently high to seriously impair high frequency operation.

One approach to solving this problem is disclosed in Patent Number 2,866,140. Bulk collector resistance is reduced by connecting a lead from a point in the collector region spaced from but near the base region to the collector lead. While this technique does lower the bulk collector resistance, it has a number of disadvantages. The connecting lead is fragile and difficult to attach between the desired point in the collector region and the collector lead. Furthermore, this connection must be made to each bar individually. Moreover, it is difficult to precisely locate the point of connection near the base region in such a manner that the electrical characteristics of transistors produced in a batch remain substantially the same.

Accordingly, the present invention contemplates and has as an important object, the provision of a junction bar transistor of simple and sturdy construction characterised by a relatively low bulk collector resistance which may be reproduced from unit to unit within relatively close tolerances.

It is another object of the invention to provide a method for fabricating junction bar transistors in accordance with the preceding object with relatively few easily controlled steps so that a large number of individual transistors may be rapidly fabricated to have nearly uniform electrical characteristics.

According to the invention, the novel transistor is a bar of semiconductor material having two closely-spaced oppositely polarized rectifying junctions defining a base region which separates a collector region from the emitter region. At least one of the regions separated by the base region includes a layer of conducting material deposited on a face thereof and extending close to but spaced from the base region. An electrode is connected to the conducting layer. Preferably, this electrode also serves as the mechanical support for the bar. In a preferred form of the invention, both collector and emitter layers include this conducting layer and attached electrode.

According to the method for fabricating the novel transistor, a crystal slice having rectifying junctions is prepared in a conventional manner. Exposed faces of the slice including the base region and thin immediately adjacent strips of the collector and emitter regions are masked with acid resistant material. The unmasked surfaces of the crystal slice are then plated with conducting material. The plated crystal slice is cut across the junctions into bars and secured to rigid conducting support members near the ends of the bars to provide mechanical support and an electrical connection to the emitter and collector regions.

Other features, objects and advantages of the invention will become apparent from the following specification when read in connection with the accompanying drawing in which:

FIG. 1 is a perspective view of a bar transistor according to the invention; and, FIG. 2 is a perspective view of a crystal slice after being plated but before being cut into individual bars.

With reference to the drawing, and more particularly FIG. 1, thereof, a perspective view of the novel bar transistor is shown.

The base region 11 of the bar 10 separates the emitter region 12 from the collector region 13. P-N junctions 14 and 15 of opposite polarity separate the base region 11 from emitter 12 and collector 13, respectively.

A conducting layer 16 is deposited upon the face 17 of collector 13. The layer 16 covers nearly the entire area of the face 17 and ends very close to, but spaced from the base region 11.

A similar conducting layer 18 covers most of the area of the face 21 of emitter region 12. Conducting rods 22 and 23 are mechanically and electrically connected to layers 18 and 16, respectively, to provide a support for the entire bar upon a suitable base (not shown) and an electrical connection to the respective regions. A third rigid conducting rod 24 is on the far side of the bar, preferably in abutting relationship therewith but electrically insulated therefrom. A lead 25 is connected between the rod 24 and the base region 11.

This arrangement of rods thus provides a sturdy support for the bar and additionally serve as electrical connections to the emitter, base and collector. The close proximity of the layer 16 to the base region 11 minimizes the effective bulk collector resistance between the base and the collector electrode 23. Moreover, the relatively large area of contact means that the precise spacing between the junction 15 and the left edge of the layer 16 is not especially critical for obtaining a desired value of bulk collector resistance. Furthermore, the simple form of the layer 16 facilitates duplicating this spacing when it is desired to produce a large number of units having like electrical characteristics. Still another advantage is that the layers 16 and 18 form convenient locations for securely connecting the electrodes 22 and 23 to insure a good mechanical and electrical connection.

Referring to FIG. 2, there is illustrated a perspective view of a crystal having two closely spaced grown junctions 14 and 15 and the conducting layers 16 and 18 deposited upon the faces 17 and 21, respectively. Reference to this drawing will be helpful in understanding the method of fabricating the bar transistor shown in FIG. 1. The crystal slice 26 is cut from a crystal which may be grown by any one of the well-known techniques to provide the base region 11 separating the emitter region 12 from the collector region 13. The slice is first cleaned with a degreasing agent and then stained by a preferential etch so that the base region is clearly distinguishable from the emitter and collector regions.

The entire exposed surfaces of the bracketed section 27, which includes the exposed surfaces of the base region 11 and the immediately adjacent areas in emitter region 12 and collector region 13, are masked with silicone tape, varnish, polystyrene, wax, or other suitable acid resistant materials. The masked crystal slice is then dipped into a solution of electroless nickel at a temperature of approximately 90° C. for about five minutes to plate the unmasked surfaces with a layer of nickel. A temperature range of 75° C. to 110° C. and a time range of from 2 to 10 minutes have been employed with satisfactory results. A longer time results in increased amounts of nickel being deposited upon the crystal slice. However, if allowed to remain in the solution too long, peeling will result. By way of example, a suitable electroless nickel bath includes the following compounds in the indicated densities.

| | Grams/liter |
|---|---|
| $NiCl_2.6H_2O$ | 30 |
| $NaH_2PO_2.H_2O$ | 10 |
| Sodium citrate | 100 |
| $NH_4Cl$ | 50 |

An alkali for neutralizing, such as $NH_4OH$, is added to bring the pH within the range of 8 to 10.

The mask is then removed and the deposited layer of nickel sintered into the crystal by heating the plated crystal in vacuum for ten (10) minutes at substantially 800 degrees centigrade plus or minus 50 degrees.

A thin layer of nickel oxide forms. A layer of noble metal will not adhere to the nickel oxide. To prepare a surface to which a noble metal will adhere, the exposed areas 27 are again masked with acid resistant material and the unmasked surfaces again electroless nickel plated in the manner described above. This second layer of nickel is then plated with gold by immersion or electroplating. Alternatively, it may be plated with platinum by electroplating. The mask is then removed and the layers 16 and 18, as shown in FIG. 2, are securely electrically and mechanically connected to the emitter and collector regions 12 and 13, respectively. The steps of plating and sintering insure a good mechanical and electrical connection to the semiconducting regions while the second nickel plating followed by noble metal plating insures a good ohmic contact to the first layer of nickel.

The structure of FIG. 2 is then cut in a direction normal to the junctions 14 and 15 to produce the bars like that shown in FIG. 1. Layers 18 and 16 are secured to rods 22 and 23, respectively, by welding, soldering, alloying or other suitable means which insures a secure mechanical and electrical connection. The members 22 and 23 reside in a conventional supporting base (not shown). This base also includes member 24 which presses against the bar to help hold it securely in place. Finally, the lead 25 is connected from the base region 11 to the conducting rod 24 and the entire unit encapsulated to complete the structure.

The novel methods thus permit the fabrication of a large number of transistors with a relatively few number of steps in a manner which enables relatively unskilled personnel to produce units having exceptionally good mechanical and electrical characteristics in a relatively short time. The importance of the relative simplicity of the novel method is better appreciated when the small size of the bar is considered. A typical value for the thickness of the crystal slice is 0.01 inch. A typical width of the base region is 0.0001 inch. A typical value for the length of the bar shown in FIG. 1 is 0.200 inch.

A transistor constructed in accordance with these techniques made of silicon having a resistivity of 2.5 ohms/centimeter showed an average bulk collector resistance of 75 ohms. This compared with a bulk collector resistance of 250 ohms for a comparable bar transistor not including the conducting layers. Moreover, it is relatively easy to duplicate these characteristics from unit to unit because the edge of the layer facing the base region 11 is relatively large so that the distance between this edge and the junction 15 may deviate somewhat from a desired nominal value to achieve a desired bulk collector resistance. Despite this tolerance, the novel methods of fabrication facilitate maintaining this spacing within very close tolerances so that in production the low bulk collector resistance has been regularly maintained within 10 ohms of the nominal 75 ohm value.

The specific times, temperatures and materials disclosed herein are for illustrating the best mode now contemplated for practicing the invention. It is evident that those skilled in the art may now make numerous modifications of and departures from the specific examples described herein without departing from the inventive concepts. Consequently, the invention is to be construed as limited only by the spirit and scope of the appended claims.

What is claimed is:

1. A grown junction bar transistor having a narrow base region separated from collector and emitter regions comprising, a first layer of nickel sintered to and along a face of said collector region extending very close to but spaced from said base region, said face being generally perpendicular to the length of said narrow base region, a second layer of nickel electroless plated to said first layer, and a conducting lead electrically connected to said second layer of nickel.

2. A grown junction bar transistor having a narrow base region separated from collector and emitter regions comprising, a first layer of nickel sintered to and along a face of said collector region extending very close to but spaced from said base region and covering nearly the entire area of said face, said face being generally perpendicular to the length of said base region, a second layer of nickel electroless plated to said first layer, and a conducting lead electrically connected to said second layer of nickel.

3. A grown junction bar transistor having a narrow base region separated from collector and emitter regions comprising, a first layer of nickel sintered to and along a face of said collector region extending very close to but spaced from said base region, said face being generally perpendicular to said base region, a second layer of nickel electroless plated to said first layer, and a conducting support member electrically and mechanically connected to said second layer of nickel for supporting said bar transistor and providing an electrical connection to said collector region.

4. A grown junction bar transistor having a narrow base region separated from collector and emitter regions comprising, a first layer of nickel sintered to and along a face of said collector region extending very close to but spaced from said base region and covering nearly the entire area of said face, said face being generally perpendicular to the length of said base region, a second layer of nickel electroless plated to said first layer, and a conducting support member electrically and mechanically connected to said second layer of nickel for supporting said bar transistor and providing an electrical connection to said collector region.

5. A grown junction bar transistor having a narrow base region separated from collector and emitter regions comprising, a first layer of nickel sintered to and along a face of said collector region extending very close to but spaced from said base region and covering nearly the entire area of said face, said face being generally perpendicular to the length of said base region, the boundary of said layer nearest said base region being substantially parallel to the boundary between said base and collector regions, a second layer of nickel electroless plated to said first layer, and a conducting lead electrically connected to said second layer of nickel.

6. A grown junction bar transistor having a narrow base region separated from collector and emitter regions comprising, a first layer of nickel sintered to and along a face of said collector region extending very close to but spaced from said base region and covering nearly the entire area of said face, said face being generally perpendicular to the length of said base region, the boundary of said layer nearest said base region being substantially parallel to the boundary between said base and collector regions, a second layer of nickel electroless plated to said first layer, and a conducting support member electrically and mechanically connected to said second layer of nickel for supporting said bar transistor and providing an electrical connection to said collector region.

7. A grown junction bar transistor having a narrow base region of one conductivity type separated from adjacent regions of opposite conductivity type comprising, a first layer of nickel sintered to and along a face of at least one of said adjacent regions, said layer being spaced from said base region and covering most of the area of said face, said face being generally perpendicular to the length of said base region, a second layer of nickel electroless plated to said first layer, and a conducting support member electrically and mechanically connected to said second layer of nickel for supporting said bar transistor and providing an electrical connection to said one adjacent region.

8. A grown junction bar transistor in accordance with claim 7 and further comprising, another first layer of nickel sintered to and along a face of the other of said adjacent regions, the latter layer being spaced from said base region and covering most of the area of said face, another second layer of nickel electroless plated to said another first layer and another conducting support member electrically and mechanically connected to said another second layer of nickel for supporting said bar transistor and providing an electrical connection to said other adjacent region.

9. A grown junction bar trasistor in accordance with claim 8 and further comprising, an electrical connection to said base region.

10. A grown junction transistor in accordance with claim 9 wherein said electrical connection comprises a rigid conducting support member generally parallel to said previously mentioned conducting support members, and a flexible lead connected between the latter rigid conducting support member and said base region.

11. A semiconductor device comprising, means defining a semiconducting region, a first layer of nickel electroless plated on and sintered to said semiconducting region, a second layer of nickel electroless plated to said first layer, and a layer of noble metal on said second layer of nickel.

References Cited by the Examiner

UNITED STATES PATENTS

| | | | |
|---|---|---|---|
| 2,429,222 | 10/1947 | Ehrhardt et al. | 317—236 X |
| 2,789,187 | 4/1957 | Romer | 200—166 |
| 2,793,420 | 5/1957 | Johnston et al. | 204—37 X |
| 2,802,159 | 8/1957 | Stump | 317—235 |
| 2,813,326 | 11/1957 | Liebowitz | 29—25.3 |
| 2,836,878 | 6/1958 | Shepard | 29—25.3 |
| 2,842,723 | 7/1958 | Koch et al. | 317—235 |
| 2,849,664 | 8/1958 | Beale | 317—235 |
| 2,937,962 | 5/1960 | Kitchens et al. | 148—33 |
| 2,957,112 | 10/1960 | Sils | 317—234 |
| 2,962,394 | 11/1960 | Andres | 117—200 X |

DAVID J. GALVIN, *Primary Examiner.*

SAMUEL BERNSTEIN, DAVID J. GALVIN, *Examiners.*